United States Patent
Mori et al.

(10) Patent No.: US 7,666,509 B2
(45) Date of Patent: Feb. 23, 2010

(54) RESIN COMPOSITION, PREPREG AND METAL-FOIL-CLAD LAMINATE

(75) Inventors: Kenichi Mori, Tokyo (JP); Takaki Tsuchida, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 335 days.

(21) Appl. No.: 11/709,804

(22) Filed: Feb. 23, 2007

(65) Prior Publication Data

US 2007/0203308 A1 Aug. 30, 2007

(30) Foreign Application Priority Data

Feb. 24, 2006 (JP) .............................. 2006-048304
Sep. 8, 2006 (JP) .............................. 2006-243927

(51) Int. Cl.
| | |
|---|---|
| *B32B 27/28* | (2006.01) |
| *B32B 27/04* | (2006.01) |
| *B32B 27/06* | (2006.01) |
| *B32B 27/18* | (2006.01) |
| *B32B 27/20* | (2006.01) |
| *B32B 27/26* | (2006.01) |
| *C08L 63/00* | (2006.01) |

(52) U.S. Cl. ................. 428/416; 428/297.4; 428/297.7; 428/413; 428/414; 428/418; 523/440; 523/443; 523/466; 525/523; 525/524; 525/525; 525/528

(58) Field of Classification Search ....................... None
See application file for complete search history.

(56) References Cited

U.S. PATENT DOCUMENTS 6,469,074 B1 * 10/2002 Hino et al. .................. 523/466
2005/0129895 A1 * 6/2005 Nakamura ................. 428/40.1

* cited by examiner

*Primary Examiner*—Michael J Feely
(74) *Attorney, Agent, or Firm*—Wenderoth, Lind & Ponack, LLP.

(57) ABSTRACT

A resin composition excellent in heat resistance after moisture absorption, lead-free solder reflow properties, dimensional stability and electrical characteristics for high-multi-layer and high-frequency-capable printed wiring boards, which composition comprises a bisphenol A type epoxy resin (a) having at least two epoxy groups per molecule and a secondary hydroxyl group amount of 0.4 meq/g or less, a novolak type epoxy resin (b) at least two epoxy groups per molecule, a cyanate ester resin (c) having at least two cyanate groups per molecule and spherical silica having an average particle diameter of 4 μm or less, wherein the equivalent ratio of cyanate groups/epoxy groups in the resin composition is in the range of 0.7 to 1.45, and a prepreg and a metal-foil-clad laminate each of which comprises the resin composition.

4 Claims, No Drawings

RESIN COMPOSITION, PREPREG AND METAL-FOIL-CLAD LAMINATE

FIELD OF THE INVENTION

The present invention relates to a resin composition excellent in heat resistance after moisture absorption, lead-free reflow ability, electrical characteristics and dimensional stability, and a prepreg and a metal-clad-laminate each of which uses the resin composition. More specifically, a metal-foil-clad laminate using the above prepreg is suitably used for printed wiring boards coping with lead-free solder reflow, high-frequency and high multilayer for mother boards and for semiconductor plastic packages comprising semiconductor chips.

In recent years, information terminal equipment such as personal computers and servers and communications equipment such as Internet routers and optical communication are required to process large data at a high speed. Hence, the speed of electric signals is increased and high-frequency electric signals are used. Accordingly, laminates for printed wiring boards used for the above equipment are required to have a low dielectric constant and a low dielectric loss tangent for coping with a demand for high frequency. In particular, a low dielectric loss tangent is required. On the other hand, lead-free solders having high melting temperatures have come to be used in view of environmental issues (JP-A-2001-308509), and higher heat resistance is also required. In particular, high-multilayer printed wiring boards have a large plate thickness so that resin recession occurs from an end portion of an inner layer pattern and delamination further occurs. Further, the absolute elongation amount at a high temperature becomes large so that a disadvantage such as through hole plating disconnection occurs. Conventionally, for laminates for high-frequency use, polyphenylene ether resins (JP-A-2005-112981) and cyanate ester resins (JP-A-2005-120173) are known.

However, polyphenylene ether resins have a relatively high molecular weight so that the melting point thereof is high. Therefore, flowing characteristics are insufficient when multilayer boards are produced. In particular, limitations are considerable concerning high-multilayer boards, and there are problems in practical utility. Further, cyanate ester resins have a low melting point and moldability thereof is excellent. Further, cyanate ester resins have properties of a low dielectric constant and a low dielectric loss tangent and have no special problem about heat resistance under eutectic solder environment. However, under lead-free environment where high-temperature treatment is carried out, an improvement in heat resistance, in particular heat resistance after moisture absorption, is required because a demand for the number of reflow treatments becomes greatly severe in accordance with a problem of the number of repairs of mounted parts, in particular with regard to high-multilayer boards.

SUMMARY OF THE INVENTION

It is an object of the present invention to provide a cyanate ester resin composition excellent in heat resistance after moisture absorption, lead-free solder reflow properties, dimensional stability and electrical characteristics, for high multilayer-capable and high frequency-capable printed wiring boards, and a prepreg and a metal-foil-clad laminate each of which uses the cyanate ester resin composition.

The present inventors have made diligent studies for attaining the above object and as a result found that heat resistance after moisture absorption and lead-free solder reflow properties are improved by mixing a bisphenol A type epoxy resin having specific natures and a novolak type epoxy resin with a cyanate ester resin in a specific equivalent ratio and jointly using a specific inorganic filler. Accordingly, the present inventors have arrived at the present invention.

The present invention provides a resin composition comprising a bisphenol A type epoxy resin (a) having at least two epoxy groups per molecule and having a secondary hydroxyl group amount of 0.4 meq/g or less, a novolak type epoxy resin (b) having at least two epoxy groups per molecule, a cyanate ester resin (c) having at least two cyanate groups per molecule and spherical silica having an average particle diameter of 4 μm or less, wherein the equivalent ratio of cyanate groups/epoxy groups in the resin composition is in the range of 0.7 to 1.45. In the resin composition provided by the present invention, the bisphenol A type epoxy resin (a) is preferably a brominated bisphenol A type epoxy resin. In the resin composition provided by the present invention, the content of the spherical silica in the resin composition is preferably 10 to 70 parts by weight per 100 parts by weight of a resin solid content in the resin composition. The present invention further provides a prepreg comprising the resin composition as defined above and a glass woven fabric. The present invention still further provides a metal-foil-clad laminate obtained by placing one prepreg as defined above or stacking at least two prepregs as defined above, disposing metal foil(s) on one surface or both surfaces of the prepreg or the resultant stack of the prepregs and laminate-molding the resultant set.

EFFECT OF THE INVENTION

Printed wiring boards obtained by using the prepreg and the metal-foil-clad laminate obtained from the resin composition of the present invention are excellent in heat resistance after moisture absorption, lead-free solder reflow properties, electric characteristics, dimensional stability and moldability. Therefore, the resin composition of the present invention is suitable as a material for high multilayer- and high frequency-capable printed wiring boards. Industrial practicality thereof is remarkably high.

DETAILED DESCRIPTION OF THE INVENTION

The bisphenol A type epoxy resin (a) used in the present invention is not specially limited so long as it is a bisphenol A type epoxy resin having at least two epoxy groups in a molecule and a secondary hydroxyl group amount of 0.4 meq/g or less. The secondary hydroxyl group amount is preferably 0.35 meq/g or less, and more preferably 0.3 meq/g or less. The bisphenol A type epoxy resin has a structure in which both ends of one bisphenol A type skeleton are glycidyl-ethereal-ized, while a byproduct having a structure in which a plurality of skeletons are bonded with a 2-hydroxy-1,3-propylidene group is also generated. It is required in the present invention that the amount of the above byproduct is small. Therefore, the amount of the byproduct is defined by the amount, per unit weight, of a secondary hydroxyl group of the 2-hydroxy-1,3-propylidene group.

The secondary hydroxyl group amount is determined by a C13-NMR method. A bisphenol A type epoxy resin (a), of which the structure is already known, is measured by C13-NMR, to determine a carbon amount ratio between a bisphenol A type skeleton, a 2-hydroxy-1,3-propylidene group and a glycidyl group. From the respective carbon numbers of the structures of these three elements, the amounts of the three elements were calculated as a molar ratio between the elements. In the molar ratio, the amount of the 2-hydroxy-1,3- propylidene group was taken as 1. The sum of respective products between values of the molar ratio and the molecular weights of the three elements, calculated from the three elements' structures, corresponds to a secondary hydroxyl group equivalent. The reciprocal thereof is a secondary hydroxyl group amount.

The secondary hydroxyl group amount is larger than 0.4 meq/g, a laminate to be obtained is decreased in electric characteristics. Specific examples of the bisphenol A type epoxy resin (a) include bisphenol A type epoxy resins having a secondary hydroxyl group amount of 0.4 meq/g or less and brominated bisphenol A type epoxy resins having a secondary hydroxyl group amount of 0.4 meq/g or less. The bisphenol A type epoxy resin (a) may be used singly or at least two bisphenol A type epoxy resins (a) may be mixed and used as required. The bisphenol A type epoxy resin (a) is preferably a brominated bisphenol A type epoxy resin having a secondary hydroxyl group amount of 0.4 meq/g or less. The amount of the bisphenol A type epoxy resin (a) per 100 parts by weight of a resin solid content in the resin composition is preferably in the range of 15 to 40 parts by weight, particularly preferably 20 to 35 parts by weight.

The novolak type epoxy resin (b) used in the present invention is not specially limited so long as it is a novolak type epoxy resin having at least two epoxy groups in a molecule. Specific examples of the novolak type epoxy resin (b) include a phenol novolak epoxy resin, a brominated phenol novolak epoxy resin, a cresol novolak epoxy resin, a bisphenol A novolak type epoxy resin, a phenol aralkyl novolak type epoxy resin, a biphenyl aralkyl novolak type epoxy resin, a naphthol aralkyl novolak type epoxy resin and a phosphorus-containing novolak type epoxy resin. These novolak epoxy resins (b) may be used alone or in combination as required. The novolak epoxy resin (b) is preferably a phenol novolak epoxy resin, a brominated phenol novolak epoxy resin, a cresol novolak epoxy resin, a biphenyl aralkyl novolak type epoxy resin, a naphthol aralkyl novolak type epoxy resin or a phosphorus-containing novolak type epoxy resin. The amount of the novolak type epoxy resin (b) per 100 parts by weight of a resin solid content in the resin composition is preferably in the range of 20 to 55 parts by weight, particularly preferably 25 to 50 parts by weight.

The cyanate ester resin (c) used in the present invention is not specially limited so long as it is a compound having at least two cyanate groups in a molecule. Specific examples of the cyanate ester resin (c) include 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4-dicyanatobiphenyl, bis(4-cyanatophenyl)methane, 2,2-bis(4-cyanatophenyl)propane, 2,2-bis(3,5-dibromo-4-cyanatophenyl)propane, bis(4-cyanatophenyl)ether, bis(4-cyanatophenyl)thioether, bis(4-cyanatophenyl)sulfone, tris(4-cyanatophenyl)phosphite, tris(4-cyanatophenyl)phosphate, a variety of cyanate ester compounds obtained by reaction between novolak and cyan halide, a naphthol aralkyl novolak type cyanate ester, and prepolymers of these. These cyanate ester resins (c) may be used alone or in combination as required. Preferable examples of the cyanate ester resin (c) include 2,2-bis(4-cyanatophenyl)propane, a phenol novolak type cyanate ester, a naphthol aralkyl novolak type cyanate ester and prepolymers of these. With regard to the amount of the cyanate ester resin (c) in the resin composition, the cyanate group/epoxy group equivalent ratio between cyanate groups of the cyanate ester resin (c) and the total epoxy groups of the bisphenol A type epoxy resin (a) and the novolak type epoxy resin (b) is in the range of 0.7 to 1.45. When the amount of the cyanate ester resin (c) is not in the above range, heat resistance after moisture absorption and lead-free reflow ability descend. The cyanate group/epoxy group equivalent ratio is preferably in the range of 0.7 to 1.35, and more preferably in the range of 0.7 to 1.3.

In the present invention, spherical silica having an average particle diameter of 4 µm or less is used. Spherical silica having an average particle diameter of 3.5 µm or less is preferably used. More preferably, spherical silica having an average particle diameter of 3 µm or less is used. In particular, spherical silica having an average particle diameter of 0.1 to 1 µm is preferable. The spherical silica is typically spherical fused silica or spherical synthetic silica. The amount of the spherical silica is not specially limited. The amount of the spherical silica per 100 parts by weight of a resin solid content in the resin composition is preferably in the range of 10 to 70 parts by weight, particularly preferably 20 to 60 parts by weight. When the average particle diameter is larger than 4 µm, a problem in flowing characteristics during molding or breakage of a small-diameter drill bit occurs. With regard to a surface treatment of the spherical silica, surface treatments generally adoptable for laminates can be used. The surface treatment is not specially limited. An epoxy silane treatment and an aminosilane treatment are preferable.

The resin composition of the present invention can further contain a curing accelerator, as required, for the purpose of properly adjusting a curing speed. The curing accelerator is not specially limited so long as it is a curing accelerator which is generally used as a curing accelerator of the bisphenol A type epoxy resin (a), the novolak type epoxy resin (b) or the cyanate ester resin (c). Specific examples thereof include salts of organic metals such as copper, zinc, cobalt and nickel, imidazoles and their derivatives, and tertiary amines.

A variety of high molecular weight compounds such as a different thermosetting resin, a thermoplastic resin, oligomers thereof and elastomers, a different flame retardant compound, an additive, and etc., can be used in the resin composition of the present invention, so long as its expected properties are not impaired. These are not specially limited so long as they are selected from generally used ones. Examples of the flame retardant compound include phosphorus compounds such as phosphoric acid ester and melamine phosphate, nitrogen compounds such as melamine and benzoguanamine, oxazine ring containing compounds and silicone compounds. The additive include an ultraviolet absorber, an antioxidant, a photoinitiator, a fluorescent brightening agent, a photosensitizer, a dye, a pigment, a thickener, a lubricant, a defoaming agent, a dispersing agent, a leveling agent, a brightening agent and a polymerization inhibitor. These additives can be used in combination as required.

An organic solvent can be used in the resin composition of the present invention as required. The organic solvent is not specially limited so long as it is compatible with a mixture of the bisphenol A type epoxy resin (a), the novolak type epoxy resin (b) and the cyanate ester resin (c) Specific examples thereof include ketones such as acetone, methyl ethyl ketone and methyl isobutyl ketone; polar solvents such as dimethyl acetamide and dimethyl formamide; and aromatic hydrocarbon solvents such as toluene and xylene. The organic solvents may be used alone or in combination.

The glass woven fabric used in the present invention includes E glass, D glass, S glass, T glass, NE glass and quartz. The thickness of the glass woven fabric is not specially limited. In view of dimension stability, a glass woven fabric having a thickness of 0.02 to 0.2 mm for laminates is preferable and a glass woven fabric having a thickness of 0.02 to 0.2 mm which has been subjected to an ultra-opening treatment or a highly spread out treatment is particularly preferable. Further, a glass woven fabric which has been subjected to a surface-treatment with a silane-coupling agent, such as an epoxy silane treatment or an aminosilane treatment, is preferably used in view of heat resistance after moisture absorption.

The method of producing the prepreg of the present invention is not specially limited so long as it is a method in which a prepreg is produced by combining the above resin composition and the glass woven fabric. Specifically, the resin composition of the present invention is impregnated into the glass woven fabric, and the resultant fabric is B-staged by drying, for example, at about 130° C. to 180° C. for about 3 to 20 minutes, whereby a prepreg having a resin amount of about 30 to 70% by weight is produced. The above resin amount includes the amount of an inorganic filler.

The metal foil used in the present invention is typically a copper foil or an aluminum foil. A copper-foil-clad laminate provided by the present invention is obtained by laminate-molding using the above prepreg. Specifically, a predetermined number of the prepregs are stacked, copper foil (s) is/are disposed on one surface or both surfaces of the resultant stack of the prepregs, and the resultant set is laminate-molded, for example, at a temperature of 180 to 220° C. for a heating time of 100 to 300 minutes at a surface pressure of 20 to 40 kg/cm$^2$, to obtain a copper-foil-clad laminate. The thickness of the copper foil to be used is not specially limited. An electrolytic copper foil having a thickness of 3 to 35 µm is preferably used. The electrolytic copper foil is not specially limited so long as it is an electrolytic copper foil which is generally used for laminates. An electrolytic copper foil of which the elongation amount is large at a high temperature is preferred in consideration of foil crack reliability in a high-multilayer board. For producing a multilayer board, for example, 35-µm copper foils are disposed on both surfaces of one prepreg of the present invention, the resultant set is laminate-molded under the above conditions, inner layer circuits are formed, the circuits are subjected to black oxide treatment, to obtain inner layer circuit boards, the inner layer circuit boards and the prepregs of the present invention are alternatively one by one disposed, copper foils are disposed as outermost layers, the resultant set is laminate-molded under the above conditions, preferably in vacuum, thereby obtaining a multilayer board.

EXAMPLES

The present invention will be explained in detail with reference to Examples and Comparative Examples, hereinafter.

Example 1

27 parts by weight of a prepolymer (CA210, cyanate equivalent 139, supplied by Mitsubishi Gas Chemical Company, Inc.) of 2,2-bis(4-cyanatophenyl)propane, 33 parts by weight of a brominated bisphenol A type epoxy resin (EPICLON 153, epoxy equivalent 400, secondary hydroxyl group amount 0.3 meq/g, supplied by DAINIPPON INK AND CHEMICALS, INCORPORATED), 40 parts by weight of a cresol novolak type epoxy resin (ESCN-220F, epoxy equivalent 215, supplied by Sumitomo Chemical Co., LTd.), 30 parts by weight of synthetic spherical silica (SC2050, average particle diameter 0.5 µm, supplied by Admatechs, Co., Ltd.) and 0.03 part by weight of zinc octylate were mixed to prepare a varnish. The varnish was diluted with methyl ethyl ketone, to obtain a diluted varnish. The diluted varnish was impregnated into an E glass cloth having a thickness of 0.1 mm and the resultant E glass cloth was dried under heat at 165° C. for 11 minutes, thereby obtaining prepregs having a resin content of 45% by weight. Separately, the diluted varnish was impregnated into an E glass cloth having a thickness of 0.1 mm, and the resultant E glass cloth was dried under the same conditions, thereby obtaining prepregs having a resin content of 55% by weight. Then, copper foils having a thickness of 35 µm each were disposed on both surfaces of one prepreg having a resin content of 45% by weight, and the resultant set was vacuum-pressed under a pressure of 30 kg/cm$^2$ at a temperature of 200° C. for 150 minutes, thereby obtaining 35 µm-copper-clad laminates having a thickness of 0.1 mm each. Separately, eight prepregs having a resin content of 55% by weight were stacked, and copper foils having a thickness of 18 µm each were disposed on both surfaces of the stack of the prepregs, and the resultant set was vacuum-pressed under a pressure of 30 kg/cm$^2$ at a temperature of 200° C. for 150 minutes to obtain an 18 µm-copper-clad laminate having a thickness of about 1.2 mm. Then, circuits were formed in the 35 µm-copper-clad laminates having a thickness of 0.1 mm, respectively, and the circuits were subjected to black oxide treatment, to prepare inner layer circuit boards. Then, the prepregs having a resin content of 55% by weight and the inner layer circuit boards were alternately one by one stacked. The total number of the prepregs and the circuit boards was 39. 18 µm-thick copper foils were disposed on both surfaces of the resultant stack, and the resultant set was vacuum-pressed under the above press conditions, thereby obtaining a forty-layer board having a thickness of about 5 mm. Penetrating through holes were made in the forty-layer board with a mechanical drill. Panel plating was carried out, then circuits were formed on the external layers, and resist was applied, thereby obtaining a printed wiring board. Table 1 shows values of the physical properties of the copper-clad laminates and the printed wiring board.

Example 2

Copper-clad laminates and a printed wiring board were obtained in the same manner as in Example 1 except that the varnish used in Example 1 was replaced with a varnish obtained by mixing 35 parts by weight of a prepolymer (CA210) of 2,2-bis(4-cyanatophenyl)propane, 33 parts by weight of a brominated bisphenol A type epoxy resin (EPICLON 153), 32 parts by weight of a cresol novolak type epoxy resin (ESCN-220F), 40 parts by weight of synthetic spherical silica (SC2050) and 0.03 part by weight of zinc octylate. The copper-clad laminates and the printed wiring board were measured for values of physical properties. Table 1 shows the results.

Example 3

Copper-clad laminates and a printed wiring board were obtained in the same manner as in Example 1 except that the varnish used in Example 1 was replaced with a varnish obtained by mixing 30 parts by weight of a prepolymer (CA210) of 2,2-bis(4-cyanatophenyl)propane, 7 parts by weight of a brominated phenol novolak type epoxy resin (BREN-S, epoxy equivalent 285, supplied by Nippon Kayaku Co., Ltd.), 25 parts by weight of a brominated bisphenol A type epoxy resin (EPICLON 153), 38 parts by weight of a cresol novolak type epoxy resin (ESCN-220F), 20 parts by weight of synthetic spherical silica (SC2050) and 0.03 part by weight of zinc octylate. The copper-clad laminates and the printed wiring board were measured for values of physical properties. Table 1 shows the results.

Example 4

Copper-clad laminates and a printed wiring board were obtained in the same manner as in Example 1 except that the varnish used in Example 1 was replaced with a varnish obtained by mixing 40 parts by weight of a prepolymer (CA210) of 2,2-bis(4-cyanatophenyl)propane, 6 parts by weight of a brominated phenol novolak type epoxy resin (BREN-S), 24 parts by weight of a brominated bisphenol A type epoxy resin (EPICLON 153), 30 parts by weight of a cresol novolak type epoxy resin (ESCN-220F), 60 parts by weight of synthetic spherical silica (SC2050) and 0.03 part by weight of zinc octylate. The copper-clad laminates and the printed wiring board were measured for values of physical properties. Table 1 shows the results.

Example 5

Copper-clad laminates and a printed wiring board were obtained in the same manner as in Example 1 except that the varnish used in Example 1 was replaced with a varnish obtained by mixing 40 parts by weight of a prepolymer (CA210) of 2,2-bis(4-cyanatophenyl)propane, 6 parts by weight of a brominated phenol novolak type epoxy resin (BREN-S), 24 parts by weight of a brominated bisphenol A type epoxy resin (EPICLON 153), 30 parts by weight of a cresol novolak type epoxy resin (ESCN-220F), 60 parts by weight of spherical fused silica (FB-3SDC, average particle diameter 3 μm, supplied by DENKI KAGAKU KOGYO KABUSHIKI KAISHA) and 0.03 part by weight of zinc octylate. The copper-clad laminates and the printed wiring board were measured for values of physical properties. Table 1 shows the results.

Comparative Example 1

Copper-clad laminates and a printed wiring board were obtained in the same manner as in Example 1 except that the varnish used in Example 1 was replaced with a varnish obtained by mixing 25 parts by weight of a prepolymer (CA210) of 2,2-bis(4-cyanatophenyl)propane, 65 parts by weight of a brominated bisphenol A type epoxy resin (EPICLON 1123P: epoxy equivalent 545, secondary hydroxyl group amount 1.6 meq/g, supplied by DAINIPPON INK AND CHEMICALS, INCORPORATED), 10 parts by weight of a cresol novolak type epoxy resin (ESCN-220F), 40 parts by weight of synthetic spherical silica (SC2050) and 0.05 part by weight of zinc octylate. The copper-clad laminates and the printed wiring board were measured for values of physical properties. Table 2 shows the results.

Comparative Example 2

Copper-clad laminates and a printed wiring board were obtained in the same manner as in Example 1 except that the varnish used in Example 1 was replaced with a varnish obtained by mixing 20 parts by weight of a prepolymer (CA210) of 2,2-bis(4-cyanatophenyl)propane, 6 parts by weight of a brominated phenol novolak type epoxy resin (BREN-S), 24 parts by weight of a brominated bisphenol A type epoxy resin (EPICLON 153), 50 parts by weight of a cresol novolak type epoxy resin (ESCN-220F), 80 parts by weight of synthetic spherical silica (SC2050) and 0.04 part by weight of zinc octylate. The copper-clad laminates and the printed wiring board were measured for values of physical properties. Table 2 shows the results.

Comparative Example 3

Copper-clad laminates and a printed wiring board were obtained in the same manner as in Example 1 except that the varnish used in Example 1 was replaced with a varnish obtained by mixing 45 parts by weight of a prepolymer (CA210) of 2,2-bis(4-cyanatophenyl)propane, 6 parts by weight of a brominated phenol novolak type epoxy resin (BREN-S), 24 parts by weight of a brominated bisphenol A type epoxy resin (EPICLON 153), 25 parts by weight of a cresol novolak type epoxy resin (ESCN-220F), 20 parts by weight of synthetic spherical silica (SC2050) and 0.04 part by weight of zinc octylate. The copper-clad laminates and the printed wiring board were measured for values of physical properties. Table 2 shows the results.

Comparative Example 4

Copper-clad laminates and a printed wiring board were obtained in the same manner as in Example 1 except that the varnish used in Example 1 was replaced with a varnish obtained by mixing 30 parts by weight of a prepolymer (CA210) of 2,2-bis(4-cyanatophenyl)propane, 70 parts by weight of a brominated phenol novolak type epoxy resin (BREN-S), 20 parts by weight of synthetic spherical silica (SC2050) and 0.03 part by weight of zinc octylate. The copper-clad laminates and the printed wiring board were measured for values of physical properties. Table 2 shows the results.

Comparative Example 5

Copper-clad laminates and a printed wiring board were obtained in the same manner as in Example 1 except that the varnish used in Example 1 was replaced with a varnish obtained by mixing 30 parts by weight of a prepolymer (CA210) of 2,2-bis(4-cyanatophenyl)propane, 70 parts by weight of a brominated bisphenol A type epoxy resin (EPICLON 153), 20 parts by weight of synthetic spherical silica (SC2050) and 0.05 part by weight of zinc octylate. The copper-clad laminates and the printed wiring board were measured for values of physical properties. Table 2 shows the results.

Comparative Example 6

Copper-clad laminates and a printed wiring board were obtained in the same manner as in Example 1 except that the varnish used in Example 1 was replaced with a varnish obtained by mixing 30 parts by weight of a prepolymer (CA210) of 2,2-bis(4-cyanatophenyl)propane, 7 parts by weight of a brominated phenol novolak type epoxy resin (BREN-S, epoxy equivalent 285, supplied by Nippon Kayaku Co., Ltd.), 25 parts by weight of a brominated bisphenol A type epoxy resin (EPICLON 153), 38 parts by weight of a cresol novolak type epoxy resin (ESCN-220F) and 0.03 part by weight of zinc octylate. The copper-clad laminates and the printed wiring board were measured for values of physical properties. Table 2 shows the results.

Comparative Example 7

Copper-clad laminates and a printed wiring board were obtained in the same manner as in Example 1 except that the varnish used in Example 1 was replaced with a varnish obtained by mixing 40 parts by weight of a prepolymer (CA210) of 2,2-bis(4-cyanatophenyl)propane, 6 parts by weight of a brominated phenol novolak type epoxy resin (BREN-S), 24 parts by weight of a brominated bisphenol A type epoxy resin (EPICLON 153), 30 parts by weight of a cresol novolak type epoxy resin (ESCN-220F), 60 parts by weight of pulverized silica (FS-20, average particle diameter 4.9 μm, supplied by DENKI KAGAKU KOGYO KABUSHIKI KAISHA) and 0.03 part by weight of zinc octylate. The copper-clad laminate and the printed wiring board were measured for values of physical properties. Table 2 shows the results.

TABLE 1

Evaluation Results

|  | Example 1 | Example 2 | Example 3 | Example 4 | Example 5 |
|---|---|---|---|---|---|
| Cyanate/epoxy (equivalent ratio) | 0.72 | 1.09 | 0.82 | 1.30 | 1.30 |
| Peel strength (Spec.: >0.8 kg/cm) | ○ | ○ | ○ | ○ | ○ |
| Dielectric loss tangent (1 GHz) | 0.0110 | 0.0090 | 0.0105 | 0.0085 | 0.0085 |
| T-288 (Spec.: 10 minutes or more) | >10 | >10 | >10 | >10 | >10 |
| Shrinkage amount (Spec.: ±2 μm) | ○ | ○ | ○ | ○ | ○ |
| Resistance to reflow | ○ | ○ | ○ | ○ | ○ |
| Breakage of drill | ○ | ○ | ○ | ○ | ○ |

TABLE 2

Evaluation Results

|  | CEx. 1 | CEx. 2 | CEx. 3 | CEx. 4 | CEx. 5 | CEx. 6 | CEx. 7 |
|---|---|---|---|---|---|---|---|
| Cyanate/epoxy (equivalent ratio) | 1.08 | 0.46 | 1.64 | 0.88 | 1.23 | 0.82 | 1.30 |
| Peel strength (Spec.: >0.8 kg/cm) | ○ | ○ | ○ | ○ | ○ | ○ | ○ |
| Dielectric loss tangent (1 GHz) | 0.0110 | 0.017 | 0.008 | 0.0115 | 0.0100 | 0.0115 | 0.0085 |
| T-288 (Spec.: 10 minutes or more) | >10 | >10 | >10 | x | x | >10 | >10 |
| Shrinkage amount (Spec.: ±2 μm) | x | ○ | x | ○ | x | ○ | ○ |
| Resistance to reflow | x | x | x | ○ | x | x | ○ |
| Breakage of drill | ○ | ○ | ○ | ○ | ○ | ○ | x |

CEx. = Comparative Example (Measurement Methods)

1) Measurement of Secondary hydroxyl group in Epoxy resin: A bisphenol A type epoxy resin (a) was measured by C13-NMR, to determine a carbon amount ratio between a bisphenol A type skeleton, a 2-hydroxy-1,3-propylidene group and a glycidyl group. From the respective carbon numbers of the structures of these three elements, the amounts of the three elements were calculated as a molar ratio between the elements. In the molar ratio, the amount of the 2-hydroxy-1,3-propylidene group was taken as 1. The reciprocal of the sum of respective products between values of the molar ratio and the molecular weights of the three elements, calculated from the three elements' structures, is a secondary hydroxyl group amount. (n=2).

2) Peel strength: A specimen (30 mm×150 mm×1.2 mm) with 18-μm copper foil was used. A peel strength of the copper foil was measured in accordance with JIS C6481. A value of 0.8 kg/cm or more was regarded as "Passing" (O). (n=2).

3) Dielectric loss tangent: A specimen was prepared by removing a copper foil of a copper-clad laminate having a thickness of 1.2 mm. A value at 1 GHz was measured by a cavity resonator perturbation method (Agilent 8722ES, supplied by Agilent Technologies). (n=6).

4) T-288 (Time to Delamination): A specimen with 18 μm-copper foil (5 mm×5 mm×1.2 mm) was used. In accordance with IPC TM-650, the specimen was heated to 288° C. with a TMA device (supplied by SII NanoTechnology Inc., EXSTAR6000TMA/SS6100) at a temperature-increasing rate of 10° C./min. After the specimen reached to 288° C., while the temperature was held constant, the period of time from the reaching to 288° C. to the occurrence of delamination was measured. Less than 10 minutes was regarded as "Not passing" (x). (n=2).

5) Shrinkage amount: A specimen with 18-μm copper foil (5 mm×5 mm×1.2 mm) was used. The specimen was heated with a TMA device (EXSTAR6000TMA/SS6100) from 30° C. to 260° C. at a temperature-increasing rate of 20° C./min., then maintained at 260° C. for 15 minutes, and then cooled down from 260° C. to 30° C. at a temperature-decreasing rate of 20° C./min. These procedures were regarded as one cycle. Five cycles were carried out. The specimen was measured for a change amount at 60° C. in the temperature increasing time in the thickness direction in each cycle. A value in the second cycle was used as a standard because an influence of curing warping existed in the first cycle. "Passing" (O) was marked when a shrinkage amount was in the range of ±2 μm in the fifth cycle. (n=3).

6) Resistance to reflow: A printed board having a thickness of about 5 mm (1 mm pitch, 5,000 through holes having φ0.25 mm each) was treated under conditions of 85° C. and 85% RH for 24 hours. Then, reflow heat treatment was 10 times repeated in a reflow heating furnace (Salamander XNB-738PC, supplied by Furukawa Electric Co., Ltd., set temperatures in 1-8 zones: 185° C., 175° C., 175° C., 192° C., 228° C., 265° C., 269° C., 190° C.) at a speed of 40 cm/min. Then, an appearance change was visually observed. (n=5).

7) Breakage of drill: copper foils having a thickness of 12 μm were disposed on both surfaces of a stack of eight prepregs having a resin content of 45% by weight, to prepare a copper-clad laminate having a thickness of 0.8 mm as a specimen (510 mm×340 mm×0.8 mm). An entry sheet (LE800, thickness 0.070 mm, supplied by Mitsubishi Gas Chemical Company, Inc.) was placed on this specimen. 5,000 holes were processed with an NC drill machine (H-MARK-20V, supplied by Hitachi Via Mechanics, Ltd.) at pitches of 0.2 mm under conditions of a drill bit (MD J492B, 0.105×1.6 mm, supplied by UNION TOOL CO.), a rotating speed 160 krpm and a feeding speed 1.2 m/min. "Passing" (O) was marked when no drill breakage occurred in the 5,000-hole processing. (n=3).

8) Average particle diameter of spherical silica: Measured with LA-750 laser diffraction/scattering type particle size distribution measuring apparatus, supplied by HORIVA.

What is claimed is:

1. A prepreg obtained by impregnating or applying a thermosetting resin composition into/to a glass woven fabric,
   wherein the thermo setting resin composition comprises:
   a bisphenol A type epoxy resin (a) having at least two epoxy groups per molecule and having a secondary hydroxyl group amount of 0.4 meq/g or less,
   a novolak type epoxy resin (b) having at least two epoxy groups per molecule,
   a cyanate ester resin (c) having at least two cyanate groups per molecule and
   spherical silica (d) having an average particle diameter of 4 µm or less, and
   wherein the amount of the bisphenol A type epoxy resin (a) per 100 parts by weight of a resin solid content in the resin composition is in the range of 15 to 40 parts by weight,
   the amount of the novolak type epoxy resin (b) per 100 parts by weight of a resin solid content in the resin composition is in the range of 20 to 55 parts by weight, and
   the equivalent ratio of cyanate groups/epoxy groups in the resin composition is in the range of 0.7 to 1.45.

2. The prepreg according to claim 1, wherein the bisphenol A type epoxy resin (a) is a brominated bisphenol A type epoxy resin.

3. The prepreg according to claim 1, wherein the content of the spherical silica in the resin composition is 10 to 70 parts by weight per 100 parts by weight of a resin solid content in the resin composition.

4. A metal-foil-clad laminate obtained by placing one prepreg as defined in claim 1 or stacking at least two prepregs as defined in claim 1, then disposing metal foil(s) on one surface or both surfaces of the prepreg or the resultant stack of the prepregs, and laminate-molding the resultant set.

* * * * *